(12) United States Patent
Cheng et al.

(10) Patent No.: US 8,953,711 B2
(45) Date of Patent: Feb. 10, 2015

(54) CONFIGURABLE PRE-EMPHASIS COMPONENT FOR TRANSMISSION CIRCUITRY

(71) Applicant: QUALCOMM Incorporated, San Diego, CA (US)

(72) Inventors: Haojen Cheng, Santa Clara, CA (US); Chiao Cheng Huang, Hsinchu (TW); Hao Zhou, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/909,478

(22) Filed: Jun. 4, 2013

(65) Prior Publication Data

US 2014/0355714 A1 Dec. 4, 2014

(51) Int. Cl.
*H04L 25/03* (2006.01)
*H04L 27/36* (2006.01)
*H03F 1/32* (2006.01)

(52) U.S. Cl.
CPC ............ *H04L 27/368* (2013.01); *H03F 1/3247* (2013.01)
USPC .......................................................... 375/297

(58) Field of Classification Search
USPC .................................................. 375/296, 297
See application file for complete search history.

(56) References Cited

U.S. PATENT DOCUMENTS

| | | | |
|---|---|---|---|
| 6,081,599 A * | 6/2000 | Zinevitch | 380/210 |
| 7,620,377 B2 | 11/2009 | Dwyer | |
| 8,204,456 B2 | 6/2012 | Xu et al. | |
| 2003/0058929 A1 | 3/2003 | Cox et al. | |
| 2003/0058959 A1 | 3/2003 | Rafie et al. | |
| 2005/0163268 A1 | 7/2005 | Mccallister | |
| 2005/0191976 A1 * | 9/2005 | Shakeshaft et al. | 455/118 |
| 2008/0267268 A1 | 10/2008 | Bury | |
| 2010/0277236 A1 | 11/2010 | Horiguchi et al. | |
| 2011/0222594 A1 * | 9/2011 | Zerbe et al. | 375/233 |
| 2012/0064847 A1 * | 3/2012 | Xu et al. | 455/114.3 |

FOREIGN PATENT DOCUMENTS

WO 0070749 11/2000

OTHER PUBLICATIONS

Larson L. et al., "Multifunctional RF Transmitters for Next Generation Wireless Transceivers," IEEE International Symposium on Circuits and Systems, 2007, pp. 753-756.
Rakers P., et al., "SAW-less Transceiver for 4G/3G/2G Cellular Standards," Fujitsu Scientific & Technical Journal, Jan. 2012, vol. 48 (1), pp. 60-68.

(Continued)

*Primary Examiner* — Don N Vo
(74) *Attorney, Agent, or Firm* — DeLizio Gilliam, PLLC

(57) ABSTRACT

A configurable pre-emphasis filter component may be configured based upon measured frequency response (e.g., filter effect) associated with at least one analog filter positioned between a digital predistortion component and a power amplification component of a transmission circuitry. The frequency response may be measured using a calibration signal sent via the transmission circuitry, a loopback circuit, and a reception circuitry. Calibration circuitry may be used with one or more loopback circuits to measure the frequency response of various analog components of the transmission circuitry. The calibration circuitry may also include logic to determine a configuration for the PEF component based upon the measured frequency response.

28 Claims, 10 Drawing Sheets

(56) References Cited

OTHER PUBLICATIONS

Scintera Networks, Inc., , "Basic PA Linearization Concepts: Predistortion Techniques vs. Operation in Backoff", http://www.scintera.com/technology/basic-linearization-concepts-predistortion-vs-backoff/ 2009-2011 , 3 pages.

"PCT Application No. PCT/US2014/040718 International Search Report", Sep. 15, 2014, 12 pages.

* cited by examiner

CONFIGURABLE PRE-EMPHASIS COMPONENT FOR TRANSMISSION CIRCUITRY

BACKGROUND

Embodiments of the inventive subject matter generally relate to the field of transmission circuitry, and, more particularly, to a configurable pre-emphasis component to compensate for analog filter distortion in transmission circuitry.

Conventional transmission circuitry allows digital information to be converted to analog signals and transmitted via energy over a wireless or wired communications channel. Digital predistortion (DPD) components may be used to compensate for non-linearity of a power amplifier (PA). Without DPD components, a power amplifier may lose a linear relationship between a source signal and an amplified output signal. Non-linear distortions may cause noise or transmission errors. Transmission errors are often measured as an error magnitude vector, or EVM. Ideally, a DPD component corrects the non-linear distortions by causing an inverse distortion of the digital signal prior to analog conversions. The DPD modified signal may cancel some or all of the non-linear distortion caused by the power amplifier so that the resulting amplified analog signal has a more linear relationship to the digital source information than would have been transmitted without the DPD.

Other components in the radio transmission circuitry may include a digital-to-analog converter (DAC), an analog filter (such as notch filter, bi-quad filter, or other baseband filters), a mixer, or other components in the transmission circuitry between the DPD component and the PA.

SUMMARY

Various embodiments are disclosed which provide a configurable pre-emphasis filter (PEF) component configured to compensate for the frequency response of at least one analog component in a transmission circuitry between the DPD component and the PA. The configurable pre-emphasis filter modifies a DPD output signal by an inverse of the frequency response of the analog component to offset the effect of the analog component on the signal.

In one embodiment, a device for transmitting signals via a communications channel comprises transmission circuitry that includes a configurable pre-emphasis filter component configured to condition a DPD output signal to compensate for analog filter effect associated with at least an analog filter positioned between a DPD component and a PA component of the radio transmission circuitry.

In one embodiment, a frequency response associated with at least one analog component positioned between a digital predistortion (DPD) component and a PA component of a transmission circuit is determined. A configurable pre-emphasis filter (PEF) component is configured to compensate for the frequency response associated with the at least one analog component

BRIEF DESCRIPTION OF THE DRAWINGS

The present embodiments may be better understood, and numerous objects, features, and advantages made apparent to those skilled in the art by referencing the accompanying drawings. In the various drawings, similar items may be identified by like reference numbers.

DESCRIPTION OF EMBODIMENT(S)

Figure 1:
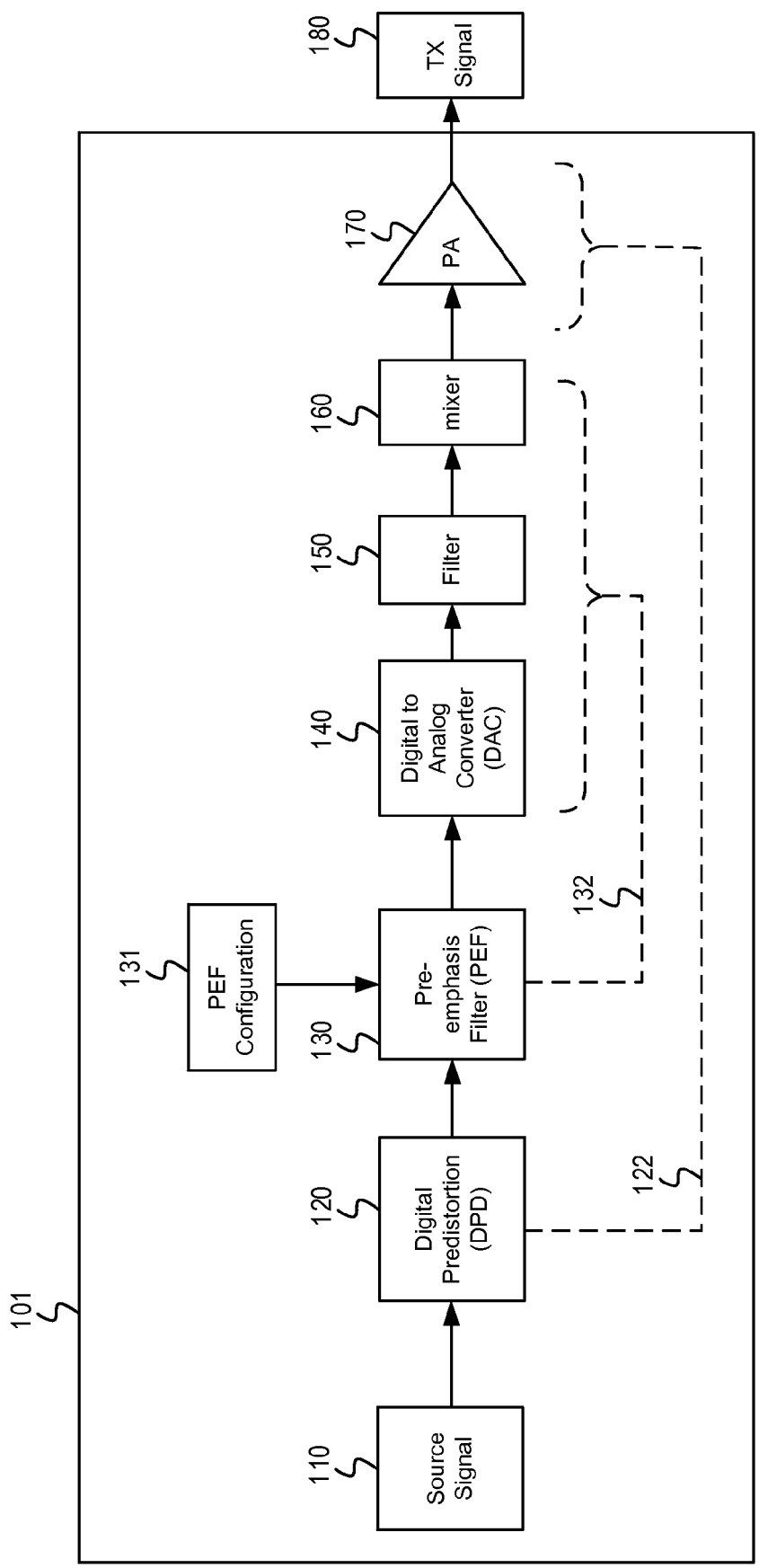
FIG. 1 is an example block diagram of an electronic device including transmission circuitry in accordance with various embodiments of the present disclosure.

The description that follows includes exemplary systems, methods, circuits, techniques, instruction sequences and computer program products that embody techniques of the present inventive subject matter. However, it is understood that the described embodiments may be practiced without these specific details. In other instances, well-known instruction instances, protocols, structures and techniques have not been shown in detail in order not to obfuscate the description.

An electronic device may be configured to transmit signals via a communications channel. For example, various electronic devices may be configured to transmit signals in the form of radio energy to another device via a wired or wireless communication media. Transmission circuitry in an electronic device may amplify a source signal as part of a transmission via the communication media. However, various components in the transmission circuitry may alter or distort the source signal, resulting in unwanted noise or distortion in the transmitted signal. To compensate for unwanted noise or distortion, transmission circuits have additional components designed to condition a signal prior to transmission. An example of this is the use of digital predistortion (DPD) to "predistort" a source signal prior to power amplification. Typically a power amplification component may add non-linear distortion to the transmitted signal. Therefore, the DPD adjusts the source signal to prepare a predistorted signal that has an inverse distortion than the non-linear distortion of the power amplification component. As a result, the transmitted signal has a closer linear relationship between the transmitted signal and the source signal.

However, there are additional analog components between a DPD component and a power amplification component. These additional analog components may add unwanted distortion to the signal. In some embodiments, a pre-emphasis filter (PEF) may be configured to modify the DPD output signal to compensate for unwanted distortions caused by the additional analog components. In one example, an analog filter may be associated with an unwanted filter response. The PEF may modify the DPD output with an inverse frequency response that cancels a measured frequency response of the analog filter or other components. In one embodiment, as a result of the PEF, the PA receives the DPD signals substantially similar to the output of the DPD component without distortions associated with the PEF or the intermediate analog circuitry.

A configurable PEF component may be configured based upon measured frequency response (also sometimes referred to as filter effect) associated with at least one analog filter positioned between the DPD component and the PA component. In one embodiment, the frequency response may be measured using calibration circuitry. The calibration circuitry may be used with one or more loopback circuits and a calibration signal generator to measure the frequency response of various analog components of the transmission circuitry. The calibration circuitry may also include logic to determine a configuration for the PEF component based upon the measured frequency response.

FIG. 1 is an example block diagram of an electronic device 101 including transmission circuitry in accordance with various embodiments of the present disclosure. At the beginning of the transmission circuitry a source signal 110 is prepared for transmission. Although shown as a logical block in FIG. 1, it should be understood that the source signal 110 may represent data present on a first interface of the transmission circuitry. In the example of FIG. 1, the transmission circuitry includes a DPD component 120.

The DPD component 120 is configured to add "predistortion" to the source signal 110. The DPD component 120 may predistort the source signal 110 using an inverse of the non-linear distortion associated with the power amplification (PA) component 170. As shown by dashed line 122, the DPD component 120 has a logical relationship with the PA component 170 because the DPD component 120 compensates the distortion associated with the PA component 170.

The predistorted signal is passed from the DPD component 120 to a pre-emphasis filter (PEF) component 130. In this example, the PEF component 130 has a logical relationship to several analog components, which include a digital-to-analog converter (DAC) 140, one or more transmission filters (such as filter 150), and a mixer 160. The PEF component 130 is configured to compensate for the unwanted frequency response (i.e., distortion) associated with the analog components. In accordance with this disclosure, the PEF component 130 is configurable. A PEF configuration 131 modifies the behavior of the PEF component 130. For example, the PEF component 130 may be a 9-taps complex finite impulse response (FIR) programmable filter and the PEF configuration 131 may represent filter coefficients used by the 9-taps FIR programmable filter. It is noted that other examples of configurations and PEF components may be utilized in the transmission circuitry in view of the present disclosure.

For example, the pre-emphasis filter may be positioned (e.g., cascaded) after the DPD component to introduce pre-emphasis of certain frequencies to correct for the linear or non-linear distortions associated with the analog components. In some embodiments, the pre-emphasis filter may be referred to as a post-DPD pre-emphasis filter (PEF). The PEF enhances the DPD pre-distorted out-band signal to compensate for subsequent analog band-limit effect. The frequency response of the PEF is the inverse of the frequency response of one or more intermediate components (between the DPD and PA) of the transmission circuitry.

From the PEF component 130, the resultant signal is passed to the DAC 140 to convert to analog form. In analog form, the signal is passed to filter 150. For example, filter 150 may be a baseband filter, notch filter, bi-quad filter, or the like. In some embodiments, multiple analog filters may be present in the transmission circuitry. The filtered signal is passed from the analog filter 150 to the mixer 160. The mixer 160, if present, is used to up-convert the signal from base-band to the RF band. The mixer 160 may also introduce analog filter effect that distorts the signal. From the mixer 160, the signal may be passed through various other analog components. In one example, the signal may be passed through a voltage-to-current converter (V2I, not shown), or other components. Lastly, the signal is passed to the PA 170 which amplifies and outputs the transmitted signal 180. In a wireless local area network (WLAN) device, the transmitted signal 180 may be output onto an antenna (not shown) so that the energy associated with the transmitted signal 180 may be propagated via a wireless communications medium.

Figure 2:
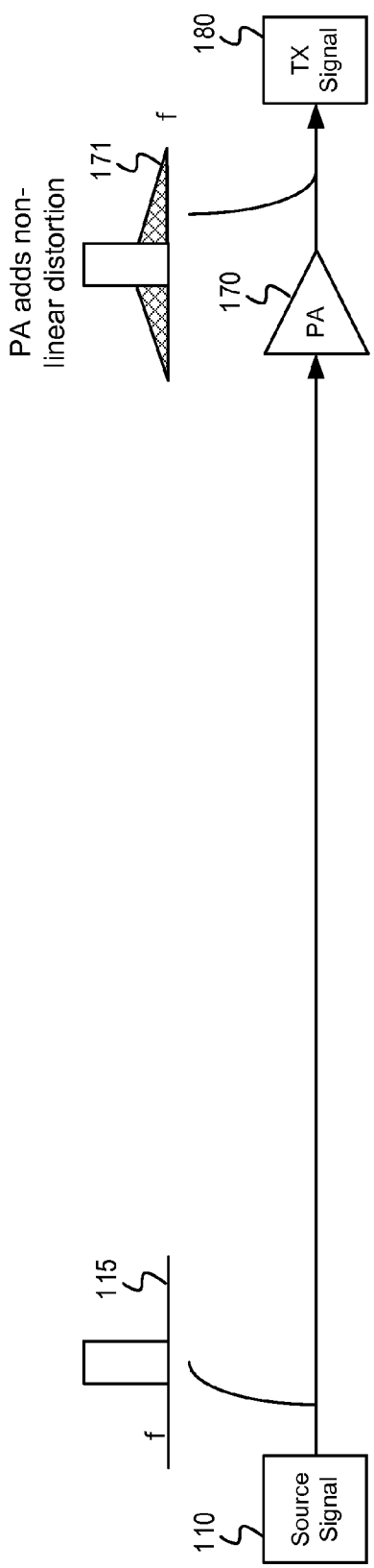
FIGS. 2-5 are conceptual diagrams illustrating the effect of various components with regard to transmission signals in accordance with various embodiments of the present disclosure.

FIG. 2 is a conceptual diagram illustrating the unwanted non-linear distortion that may be introduced by a PA 170. As described previously, the PA 170 may introduce unwanted non-linear distortion to the signal. For example, when a multi-tone signal (having multiple frequencies) is amplified, inter-modulation may introduce non-linear distortions or leakage in other frequencies. In FIG. 2, a source signal is illustrated using a first conceptual frequency graph 115. A white bar indicates the frequency which is intended to carry a signal. However, after the source signal 110 is amplified using the PA 170, the resulting transmitted signal 180 includes non-linear distortion. A second conceptual frequency graph 171 shows the white bar but also shows the hatched areas where other frequencies have power gain due to the non-linear distortion caused by the PA 170. It should be noted that non-linear distortion may also be present in the white bar area (e.g. non-linear distortion for in-band frequencies).

Figure 3:
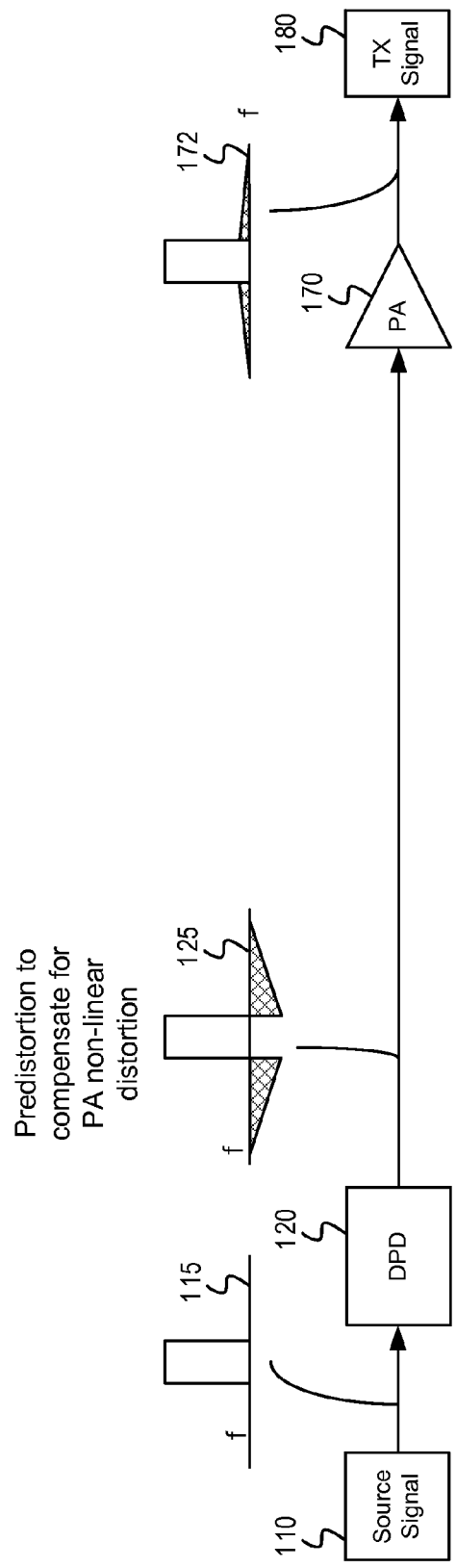

FIG. 3 is a conceptual diagram illustrating a DPD component 120 that introduces predistortion (which corrects the PA distortion) to the signal so that the transmitted signal 180 more closely resembles a linear relationship to the source signal 110. Same as with FIG. 2, the source signal 110 may be represented by a first conceptual frequency graph 115. After the source signal 110 is predistorted by the DPD component 120, the predistorted signal may be represented by a second conceptual frequency graph 125 (which also shows hatched areas showing predistortion). The predistorted signal may have non-linear predistortion that is inverse to non-linear the distortion associated with the PA 170. Due to the predistortion, once the predistorted signal is amplified by the PA 170, the resulting transmitted signal 180 will have less distortion. For example, the conceptual frequency graph 172 indicates little or no distortion on the other frequencies that were not part of the original source signal 110.

Figure 4:
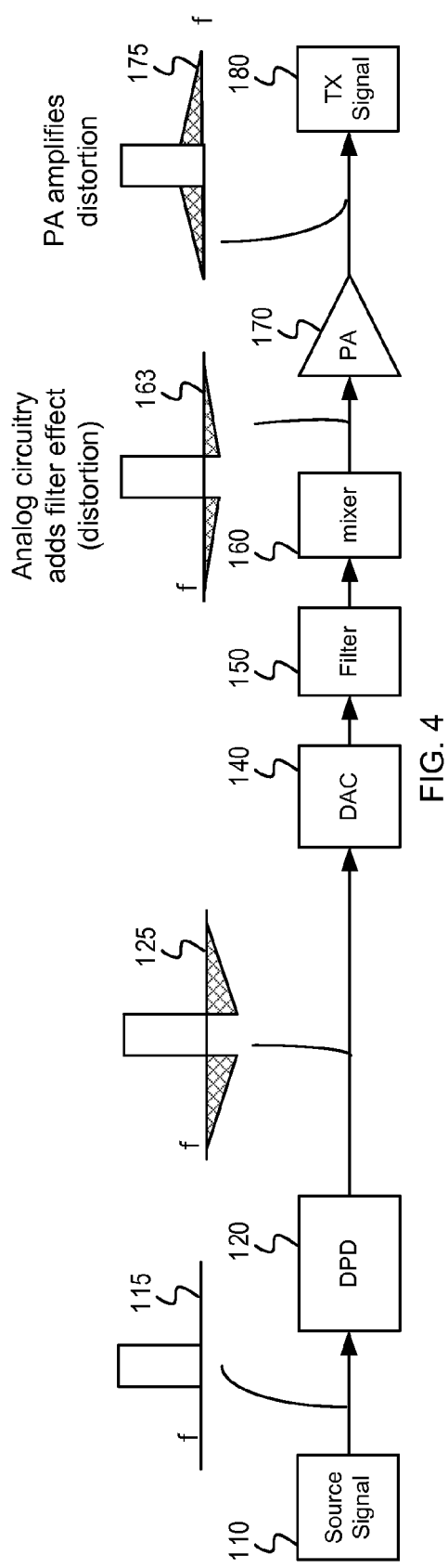

FIG. 4 is a conceptual diagram illustrating a transmission circuit with additional analog components. As with FIGS. 2 and 3, a source signal is represented by a first conceptual frequency graph 115. A DPD component 120 adds predistortion to the source signal 110, and the predistorted signal is represented by the second conceptual frequency graph 125. The predistorted signal is then passed through several analog components: a DAC 140, a filter 150, and a mixer 160. As a result of unwanted distortion (e.g., filter effect), the predistorted signal is further changed, as represented by a third conceptual frequency graph 163. It is noted that the extra unwanted distortion may be linear or non-linear and may impact other frequencies that are not part of the original signal. In the example in FIG. 4, the analog components may have a linear frequency response. Typically, several analog components (such as the DAC 140, filter 150, and mixer 160)

are cascaded after the DPD component 120 and before the PA 170. The analog components may have limiting effects such as amplitude attenuation, group delay distortion (i.e., phase is not linear) and pass band imperfection (e.g., amplitude ripple and phase nonlinearity) that may not be efficiently corrected by the DPD component 120. For example, the performance of the DPD component 120 may be limited based upon the width of the analog bandwidth spreading of the source signal 110 and the predistorted signal. A wider analog bandwidth may lead to higher noise, power consumption, and higher cost.

Once the signal is passed through the PA 170, the resulting transmitted signal 180 may have unwanted distortions that were introduced by one or more of the analog components. The transmitted signal 180 may be represented by the fourth conceptual frequency graph 175.

Figure 5:
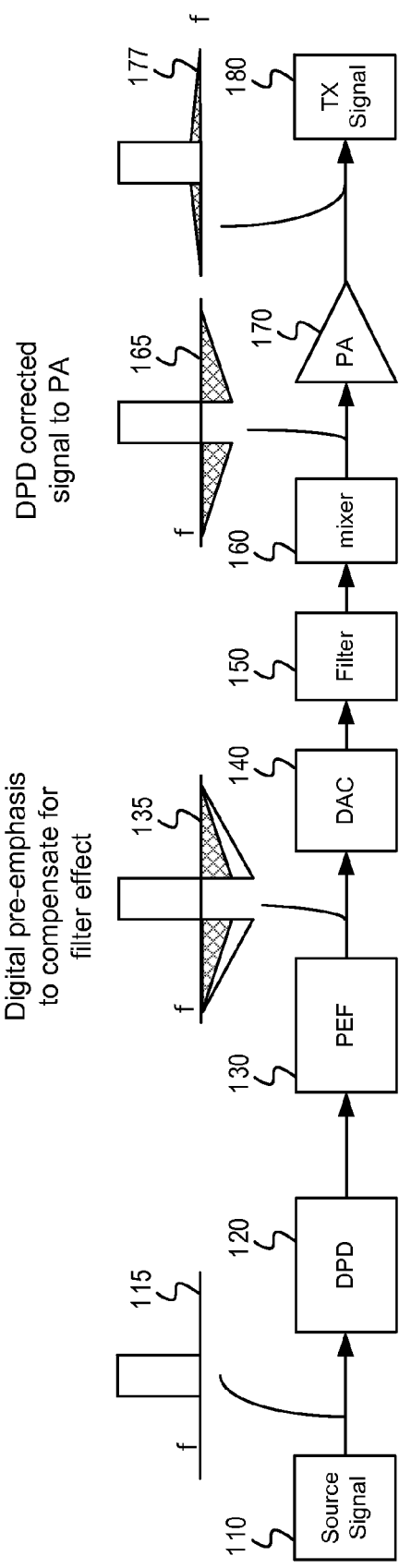

FIG. 5 is a conceptual diagram illustrating a PEF component 130 that adjusts for the unwanted distortion introduced by the analog components. Same as in previous figures, the source signal 110 (represented by first conceptual frequency graph 115) is passed through a DPD component 120 to generate a predistorted signal. The predistorted signal is then passed through the PEF component 130 which adds digital pre-emphasis to the predistorted signal to correct (or minimize) the distortions of the analog components between the DPD component 120 and the PA 170. The predistorted signal with pre-emphasis is represented by the second conceptual frequency graph 135, where the hatched area shows the pre-distortion, and the white area below the hatched area shows the pre-emphasis. The resulting signal is then passed through the analog components: DAC 140, filter 150, and mixer 160. The analog components introduce distortions (same as with FIG. 4), but because the pre-emphasis is inverse to the analog component distortions, the signal (represented by third conceptual frequency graph 165) that is provided to the PA 170 closely resembles the predistorted signal (without the analog component distortions). After the predistorted signal is amplified by the PA 170, the transmitted signal 180 may bear an approximately linear relationship with the source signal 110. The fourth conceptual frequency graph 177 shows little or no distortion to the transmitted signal 180.

The characteristic of filtering effect for radio transmission circuitry may vary over particular circuit boards, temperatures, and supply voltages. Therefore, in some embodiments, the PEF component may be configured based on measured frequency response of the transmission circuitry. For example, the PEF may be calibrated to specific conditions of the particular transmission circuitry.

Figure 6:
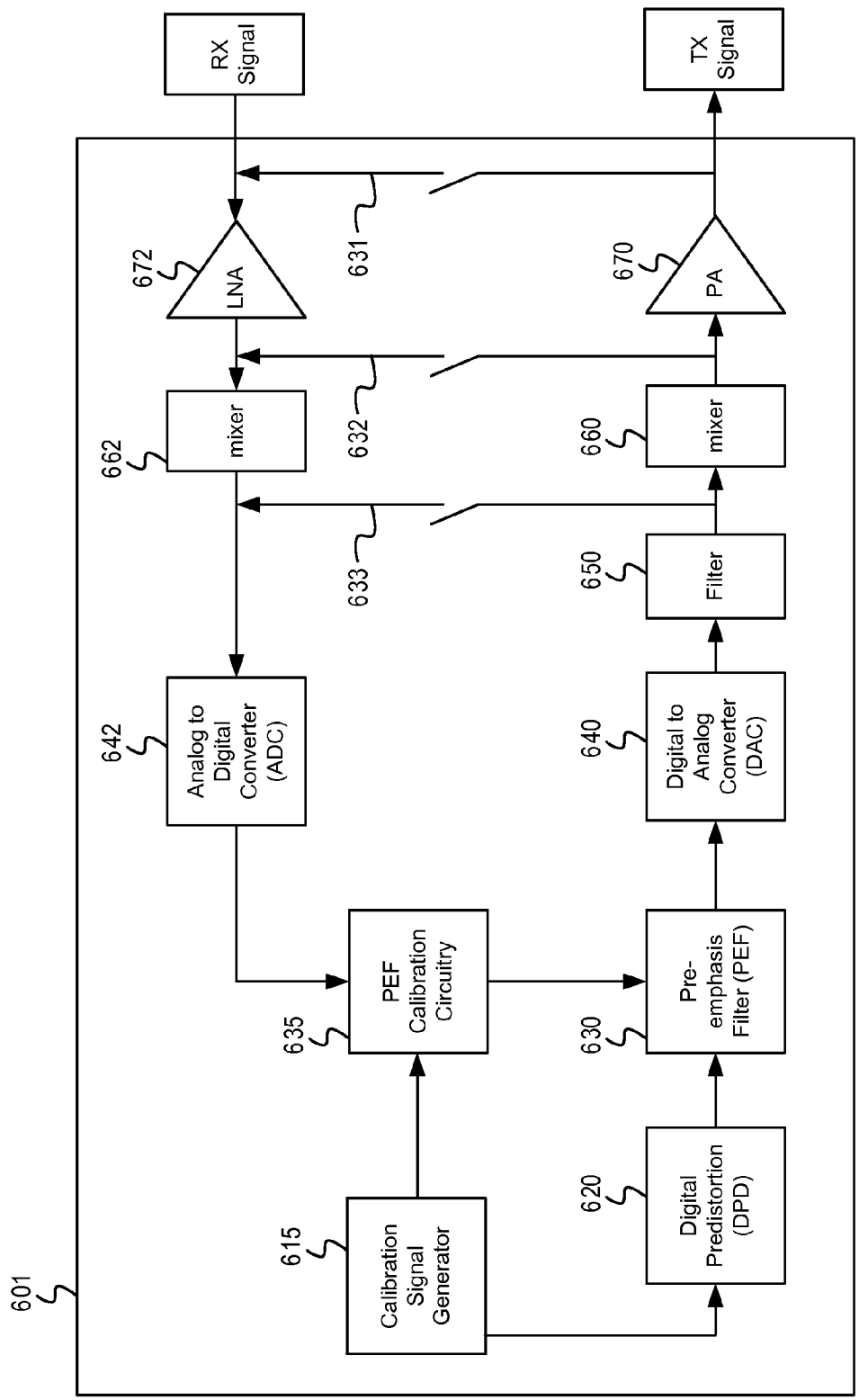
FIG. 6 is an example block diagram of an electronic device including calibration circuitry in accordance with various embodiments of the present disclosure.

FIG. 6 is an example block diagram of an electronic device 601 including calibration circuitry 635 in accordance with various embodiments of the present disclosure. Various options for calibration circuitry are described. As in previous figures, the transmission circuitry may include a DPD component 620, a configurable PEF component 630, a DAC 640, a filter 650, a mixer 660, and a PA 670. The electronic device 601 also includes reception circuitry. The reception circuitry includes a low noise amplifier (LNA) 672, a mixer 662, and an analog-to-digital converter (ADC) 642. The electronic device also includes a calibration signal generator 615 and PEF calibration circuitry 635.

The calibration circuitry 635 may be used with one of a plurality of loopback circuits 631, 632, 633. The calibration circuitry 635 may select one of the loopback circuits depending on which analog components are being measured for frequency response. In some embodiments, the calibration circuitry 635 may perform multiple tests to determine various frequency responses for different analog components. Typically, loopback tests utilize a calibration signal provided by the calibration signal generator 615. When measuring the frequency response using the loopbacks, the PEF component 630 may be disabled (i.e., no pre-emphasis added to the calibration signal). In this figure, three example loopback circuits are described:

A first loopback 631 is located after PA 670. The first loopback 631 couples the output of the PA 670 to the input of the LNA 672. This loopback path utilizes a full DPD calibration path, such as through full TX path, coupling to LNA input of the RX path, then following RX path. In this loop back option, the whole TX chain filtering effect may be measured and calibrated. However, unless it is removed from the calibration measurements, unrelated RX band-limited effect may also distort the signal and affect the frequency response measurements. To reduce the RX filtering effect distortion, the mixers 660, 662 may be configured as low-Q mode when doing either DPD or PEF calibration to have wider RX bandwidth. Low-Q mode indicates that a wider filtering bandwidth is used. It should be noted that other components (not shown) may also be present in the loopback path. To minimize the effects of the other components, the low-Q mode may be used. In some embodiments, when using this loopback path, the calibration signal will be transmitted at a lower power level so that the non-linear distortion effects of the PA 670 are negligible. The DPD component 620 and PA 670 may be modified so that their impact on the calibration signal may be insignificant.

A second loopback 632 is located after the mixer 660 and couples the output of the mixer 660 on the TX path to the input of the mixer 662 on the RX path. This loopback path utilizes most of the TX path and RX path, but avoids potential distortions associated with the PA and the LNA. When using this loopback path, the DPD component 620 may be disabled (i.e., not introducing predistortion to the calibration signal).

A third loopback 633 is located after the analog filter 650. This loopback path may be useful to measure and calibrate the transmission analog filtering effect. The DPD component 620 and PEF component 630 may be disabled (i.e. no predistortion and no pre-emphasis). The calibration signal then passes through the DAC 640, the analog filter 650 then to the ADC 642 on the reception circuitry. The loopback path may prevent the RX filtering effect from being measured. In one example, this loopback path may provide a more accurate measurement of the analog filtering effect. Therefore, the PEF may be calibrated to compensate for the distortions of the analog filter 650, which typically introduces a large amount of the analog distortion in the transmission path. In one embodiment, the third loopback 633 may be used to isolate the analog filtering effect without the distortions that might be introduced from other analog components after the analog filter 650.

Once a loopback path option is selected, a calibration signal may be generated by the calibration signal generator 615 and passed through the transmission circuitry to one of the loopbacks. The calibration signal is also sent to the PEF calibration circuitry 635. As the calibration signal traverses the transmission circuitry, loopback circuit, and reception circuitry, the calibration signal may be distorted by one or more of the analog components in the transmission circuitry. The received signal is collected by the PEF calibration circuitry 635 and compared with the original calibration signal to determine the frequency response of the loopback test. While there may be some distortions to the received signal that are attributed to the reception circuitry, the distortions include the filter effect of the transmission circuitry. By utilizing various loopback tests or by adjusting the received signal to remove known frequency responses associated with the reception equipment, the PEF calibration circuitry 635 may be able to determine a frequency response associated with specific components of the transmission circuitry.

The PEF calibration circuitry 635 may determine a configuration for the PEF component 630 that compensates (i.e., inverse distortion) for the frequency response associated with at least one analog component (e.g., at least one analog filter) of the transmission circuitry.

Figure 7:
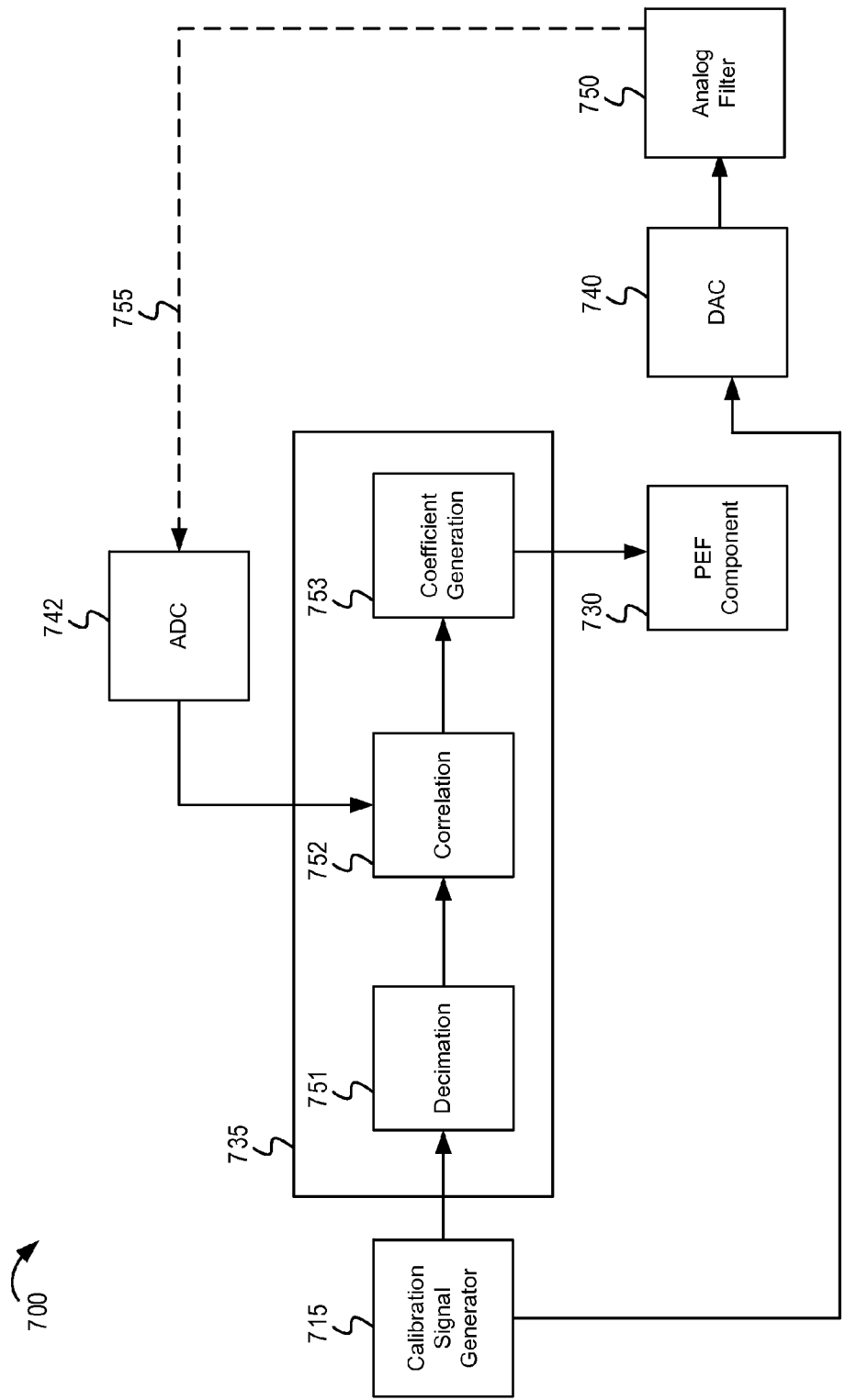
FIG. 7 is a block diagram showing an example calibration circuitry in accordance with an embodiment of the present disclosure.

FIG. 7 is a block diagram showing an example calibration loopback test 700 in accordance with an embodiment of the present disclosure. A calibration signal generator 715 generates a calibration signal that is passed to a DAC 740. The signal is then passed to the analog filter 750. Depending on which loopback circuit is used, other analog components of the transmission circuitry may also be included in the loopback test. In this example, the loopback test couples (via loopback circuit 755) the output of the analog filter 750 to the ADC 742. In the example of FIG. 7, the calibration signal includes a sweep of frequencies. For example, the calibration signal may comprise a tone with frequencies from −155 MHz to 155 MHz using 2.5 MHz frequency steps. In the example of FIG. 7, the DAC may have a sampling rate of, e.g., 320 MHz while the ADC may have a sampling rate of, e.g., 160 MHz. In the example, the DAC has a higher sampling rate (twice) that of the ADC.

Illustrated in FIG. 7, the calibration circuitry 735 may include a decimation unit 751, a correlation unit 752 and a coefficient generation unit 753, which are described in more detail below.

The decimation unit 751 may be used to accommodate the difference in the sampling rate used by the DAC and the ADC. For example, the calibration signal may be passed through a 2:1 decimation component to conform the calibration signal to the received signal. Because the received signal was passed through a DAC that has a higher sampling rate (twice) that of the ADC on the receive path, the received signal would half the resolution of the calibration signal. The decimation unit 751 aligns the calibration signal resolution to the received signal resolution.

The correlation unit 752 compares the received signal with the reference signal (the calibration signal, adjusted by the decimation unit 751, is considered the reference signal). The received signal and reference signal are aligned and compared to determine complex correlations. In some embodiments, before correlation, an automatic gain control, gain sizing, and DC offset compensation may be performed on the received signal so that the received signal is better suited for correlation. For example, the automatic gain control and DC offset compensation may be used to adjust the received signal to the proper power level with less (or no) saturation. The complex correlations may be represented as a complex correlation (e.g. having real and imaginary parts I and Q for each value) associated with each frequency in the frequency response test. The complex correlations may be stored in memory.

The coefficient generation unit 753 generates PEF coefficients based upon the complex correlations. For example, the PEF coefficients may be determined based upon the stored values of complex correlations for each frequency in the frequency response test. The coefficients may be determined using matrix calculations using the complex correlations and the original calibration signal. For example, the complex frequency response of the received calibration signal may be compared to the complex frequency values associated with the transmitted original calibration signal. An inverse of the complex frequency response may be used to determine the desired pre-emphasis. The PEF coefficients may be determined based on the desired pre-emphasis for each frequency after converting the desired pre-emphasis from frequency domain to the time domain. The coefficients are used by the digital PEF to adjust the predistorted signal by an inverse of the frequency response measured in the frequency response test.

As a result of measuring the actual frequency response of the transmission circuitry, the PEF component 730 may be configured with pre-emphasis coefficients from the coefficient generation unit 753.

Figure 8:
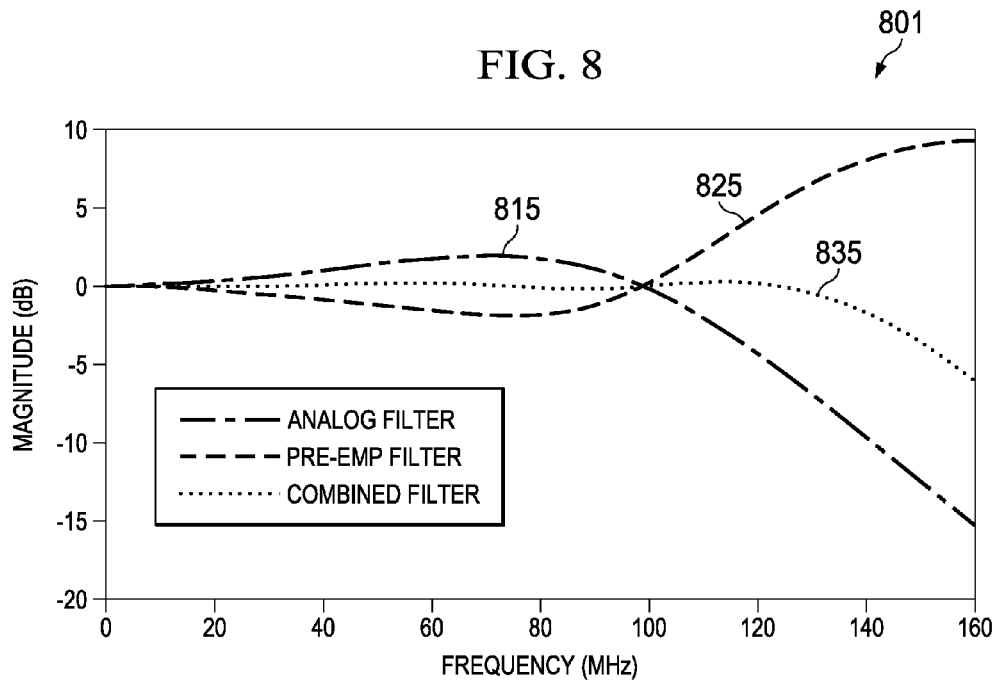
FIG. 8 is a graphical illustration of pre-emphasis signal conditioning in accordance with an embodiment of the present disclosure.
Figure 8:
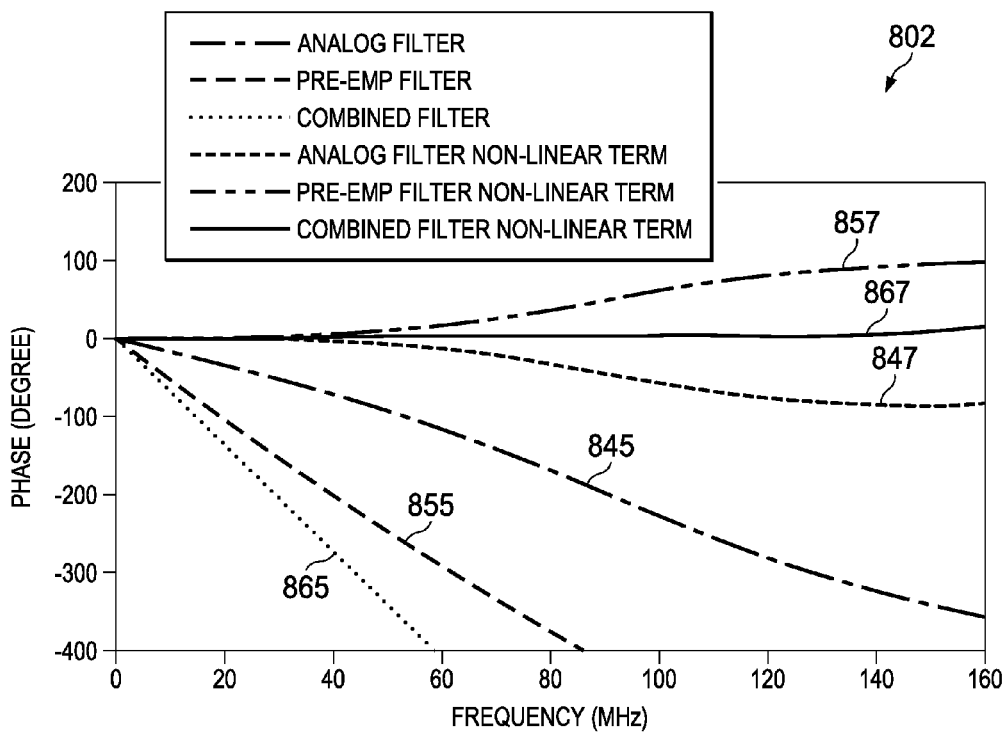

FIG. 8 is a graphical illustration of pre-emphasis signal conditioning in accordance with an embodiment of the present disclosure. A first graph 801 shows the magnitude response associated with an example pre-emphasis filter. Curve 815 shows the measured frequency-magnitude response of at least one analog component of the transmission circuitry (such as the analog filter). Curve 825 shows the frequency-magnitude response of the PEF filter configured with pre-emphasis coefficients. Curve 835 shows the combined signal that would result from passing the signal through the PEF component and the analog filter. The combined signal shows a flat magnitude response for the frequencies from 0-120 MHz.

Graph 802 shows the phase response associated with an example pre-emphasis filter. Curve 845 shows the measured frequency-phase response of at least one analog component of the transmission circuitry (such as the analog filter). Curve 855 shows the frequency-phase response of the PEF filter configured with pre-emphasis coefficients. Curve 865 shows the combined signal that would result from passing the signal through the PEF component and the analog filter. The combined signal shows a linear phase response. The dashed curves 847, 857, 867 show the non-linear phase term. For example, a linear line from 0-20 MHz may be extended. The phase error between this extended linear line and the pre-emphasis filter effect may be regarded as non-linear phase term for the pre-emphasis filter and plotted as dashed curve 857. Similarly, the dashed curve 847 represents the non-linear phase term associated with the extended linear representation of analog filter effect of curve 845. Dashed curve 867 represents a combined non-linear term from both the dashed curve 847 (filter effect) and dashed curve 857 (pre-emphasis effect).

Figure 9:
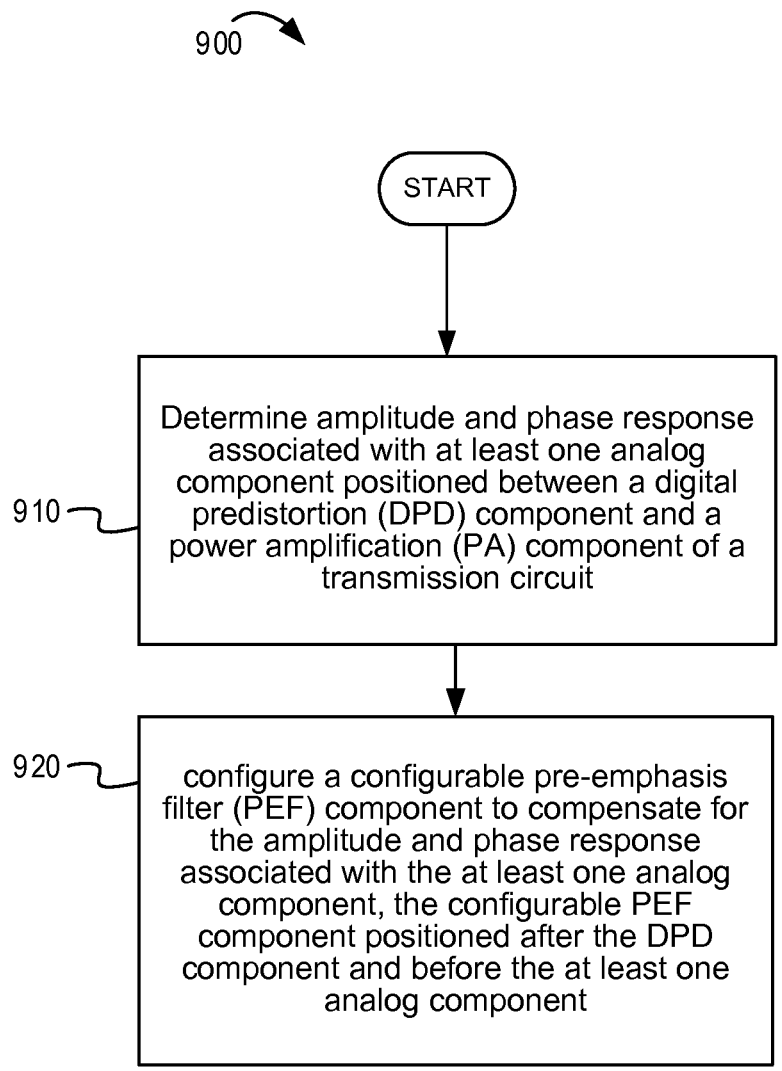
FIG. 9 is a flow diagram regarding the use of a pre-emphasis filter component in accordance with an embodiment of the present disclosure.

FIG. 9 is a flow diagram 900 regarding the use of a pre-emphasis filter component in accordance with an embodiment of the present disclosure.

At block 910, a device may determine amplitude and phase response associated with at least one analog component positioned between a digital predistortion (DPD) component and a power amplification (PA) component of a transmission circuit.

At block 920, the device may configure a configurable pre-emphasis filter (PEF) component to compensate for the amplitude and phase response associated with the at least one analog component, the configurable PEF component positioned after the DPD component and before the at least one analog component.

Figure 10:
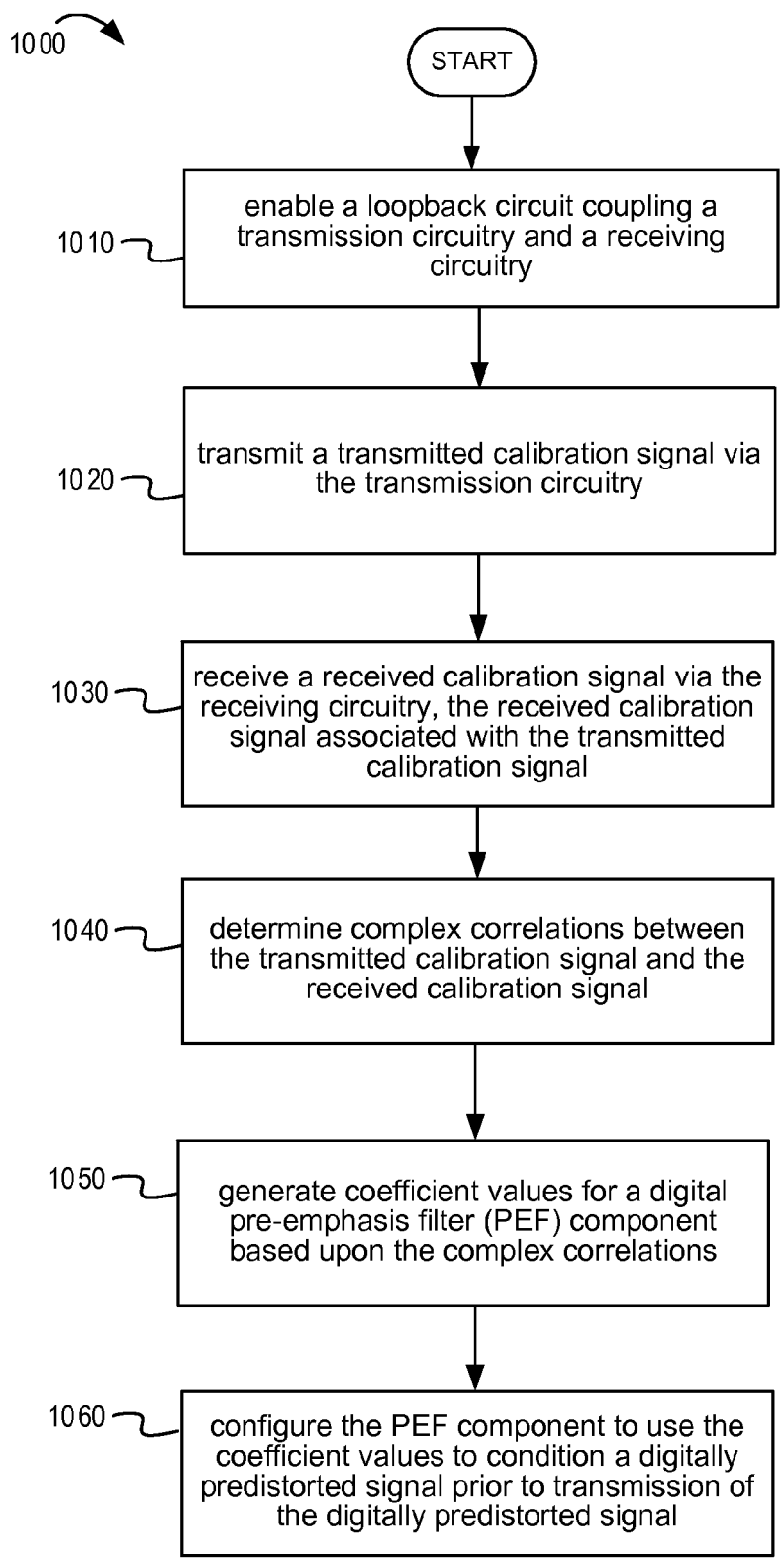
FIG. 10 is a flow diagram regarding the configuration of a configurable pre-emphasis filter component in accordance with an embodiment of the present disclosure.

FIG. 10 is a flow diagram 1000 regarding the configuration of a configurable pre-emphasis filter component in accordance with an embodiment of the present disclosure.

At block 1010, a loopback circuit coupling a transmission circuitry and a receiving circuitry may be enabled. At block 1020, a calibration signal is transmitted via the transmission circuitry.

At block 1030, the calibration signal is received via the receiving circuitry, the received calibration signal associated with the transmitted calibration signal. At block 1040, the flow includes determining complex correlations between the transmitted calibration signal and the received calibration signal.

At block 1050, coefficient values for a digital pre-emphasis filter (PEF) component may be determined based upon the complex correlations. At block 1060, the PEF component may be configured to use the coefficient values to condition a digitally predistorted signal prior to transmission of the digitally predistorted signal.

Figure 11:
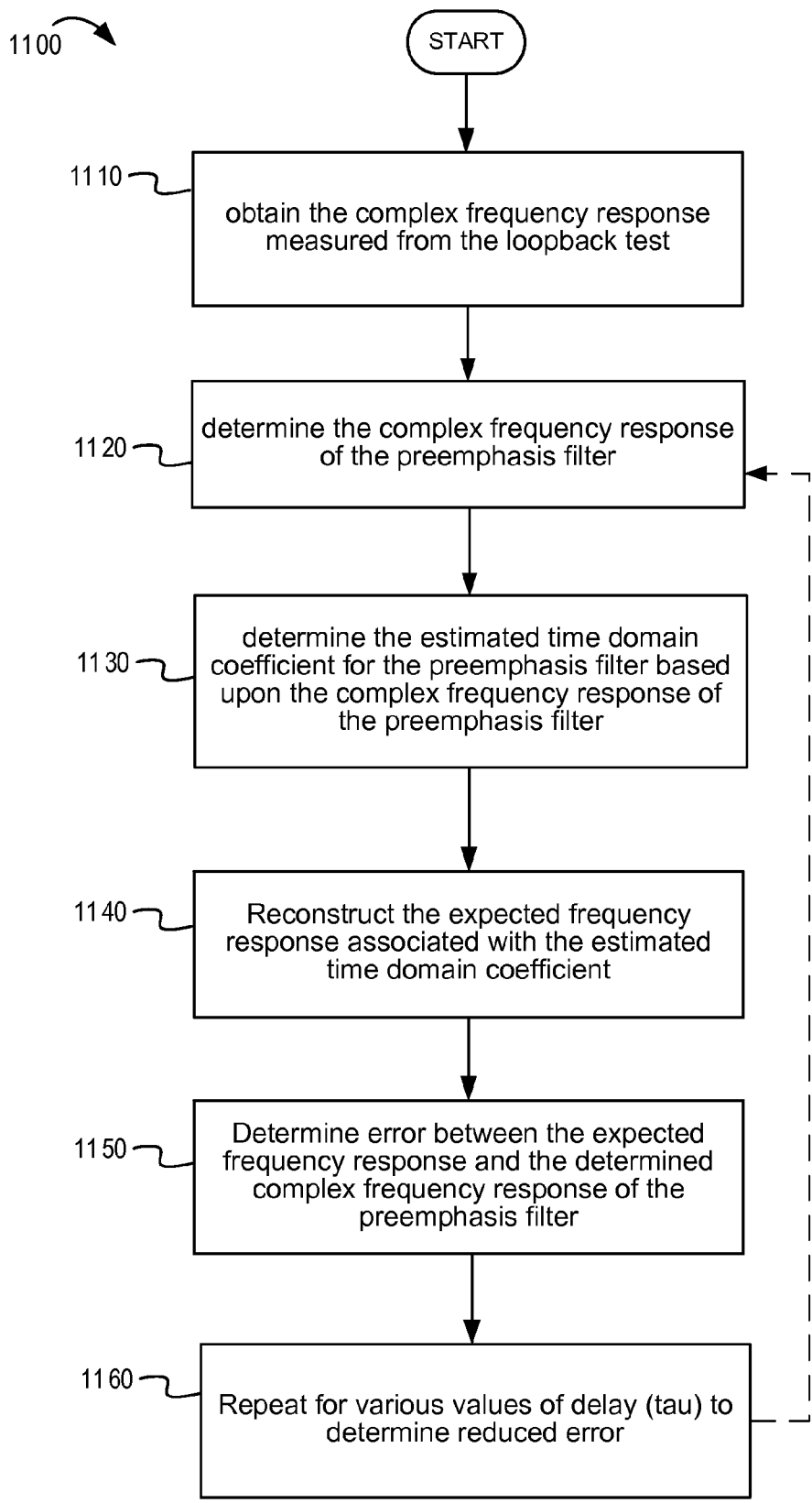
FIG. 11 is a flow diagram showing the determination of pre-emphasis filter coefficient values in accordance with an embodiment of the present disclosure.

FIG. 11 is a flow diagram 1100 showing the determination of pre-emphasis filter coefficient values in accordance with an embodiment of the present disclosure. For example, the determination of pre-emphasis filter coefficient values may be performed by the coefficient generation unit 753 of FIG. 7.

At 1110, a method may include obtaining the frequency response measured from the loopback test. For example, the frequency response may be represented as a matrix $H_{TX}$ of the complex frequency response of the loop-back at a set of frequency points W. The frequency points W may contain the normalized frequency values within the interval [0, PI] (e.g., W is in units of radians/sample).

At 1120, the method may include determining the complex frequency response of the pre-emphasis filter. A given delay $\tau$ ("tau") may be used in determining the complex frequency response of the pre-emphasis filter. The determined complex frequency response of the pre-emphasis filter is associated with the desired non-linear distortion to compensate for the unwanted filter response measured from the loopback test. The complex frequency response of the pre-emphasis filter may be represented as a matrix $H_{PEF}$. The $H_{PEF}$ makes $H_{PEF}*H_{TX}$ be unit gain and in linear phase. In one example, the complex frequency response of an N-taps (e.g., 9 taps) FIR pre-emphasis filter may be calculated as $H_{PEF}=(1/H_{TX})*e^{-j w \tau}$ where tau $\tau$ is constant delay which gives the main tap of $h_{PEF}$ in the middle. $h_{PEF}$ represents the complex coefficients of the FIR pre-emphasis filter. A frequency domain to time domain process (e.g. invfreqz) may be used to determine $h_{PEF}$ from the $H_{PEF}$. The $h_{PEF}$ are used by the PEF in the digital time domain prior to the DAC conversion.

At 1130, the method may include determining the estimated time domain coefficient for the pre-emphasis filter. The estimated time domain coefficients may be based upon the complex frequency response of the pre-emphasis filter determined in block 1120. In one implementation, the estimated time domain coefficient can be determined by following equation $$\underline{h'_{PEF}} = \underline{H_{PEF}} \cdot W^H \cdot (W \cdot W^H)^{-1}$$

Where:

$$\underline{H_{PEF}} = \underline{h_{PEF}} \cdot W$$

$$\underline{H_{PEF}} = [e^{jw_0} \; e^{jw_1} \; \ldots \; e^{jw_{K-1}}]$$

$$\underline{h_{PEF}} = [h_{PEF}(0) \; h_{PEF}(1) \; \ldots \; h_{PEF}(N-1)]$$

$$W = \begin{bmatrix} e^{-jw_0 \cdot 0} & e^{-jw_1 \cdot 0} & \ldots & e^{-jw_{K-1} \cdot 0} \\ e^{-jw_0 \cdot 1} & e^{-jw_1 \cdot 1} & \ldots & e^{-jw_{K-1} \cdot 1} \\ \vdots & \vdots & \ldots & \vdots \\ e^{-jw_0 \cdot (N-1)} & e^{-jw_1 \cdot (N-1)} & \ldots & e^{-jw_{K-1} \cdot (N-1)} \end{bmatrix}$$

The $w_k$ represents tone frequency point. In this example, there may be K tone frequencies over interested bandwidth.

At 1140, the method may include reconstructing the expected frequency response associated with the estimated time domain coefficient. For example, after getting the estimated coefficient $$\underline{h'_{PEF}},$$

, it may be possible to reconstruct the expected frequency response by the formula $$\underline{H'_{PEF}} = \underline{h'_{PEF}} \cdot W.$$

At 1150, the method may include determining error between the expected frequency response and the determined complex frequency response of the pre-emphasis filter. The error may be based upon a comparison of the expected frequency response reconstructed in block 1150 with the desired frequency response determined at block 1120 at various tone frequencies. For example, the estimated error may be calculated by the formula:

$$\sum_{k=0}^{K-1} (\underline{H'_{PEF}(k)} - \underline{H_{PEF}(k)})^2.$$

At 1160, the method may include repeating blocks 1120-1150 for various values of delay (tau) to determine estimated time domain coefficients that have a reduced error from among the various values of delay (e.g., below of specified threshold or minimized in relation to the other coefficients). Since the # of FIR taps may be limited (e.g., 9 taps), it may be desirable to try several values for the FIR group delay $\tau$ to have a reduced estimated error.

It should be understood that the example flow diagram in FIG. 11 is simply an example. Other ways of determining the PEF coefficient values may be readily conceived by persons of skill in the art. The PEF coefficient generator may be implemented as software or hardware, or combination of software and hardware.

It should be understood that FIGS. 1-11 and the operations described herein are examples meant to aid in understanding embodiments and should not be used to limit embodiments or limit scope of the claims. Embodiments may perform additional operations, fewer operations, operations in a different order, operations in parallel, and some operations differently.

As will be appreciated by one skilled in the art, aspects of the present inventive subject matter may be embodied as a system, method, or computer program product. Accordingly, aspects of the present inventive subject matter may take the form of an entirely hardware embodiment, a software embodiment (including firmware, resident software, microcode, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more non-transitory computer readable medium(s) may be utilized. Non-transitory computer-readable media comprise all computer-readable media, with the sole exception being a transitory, propagating signal.

The non-transitory computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code embodied on a computer readable medium for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 12:
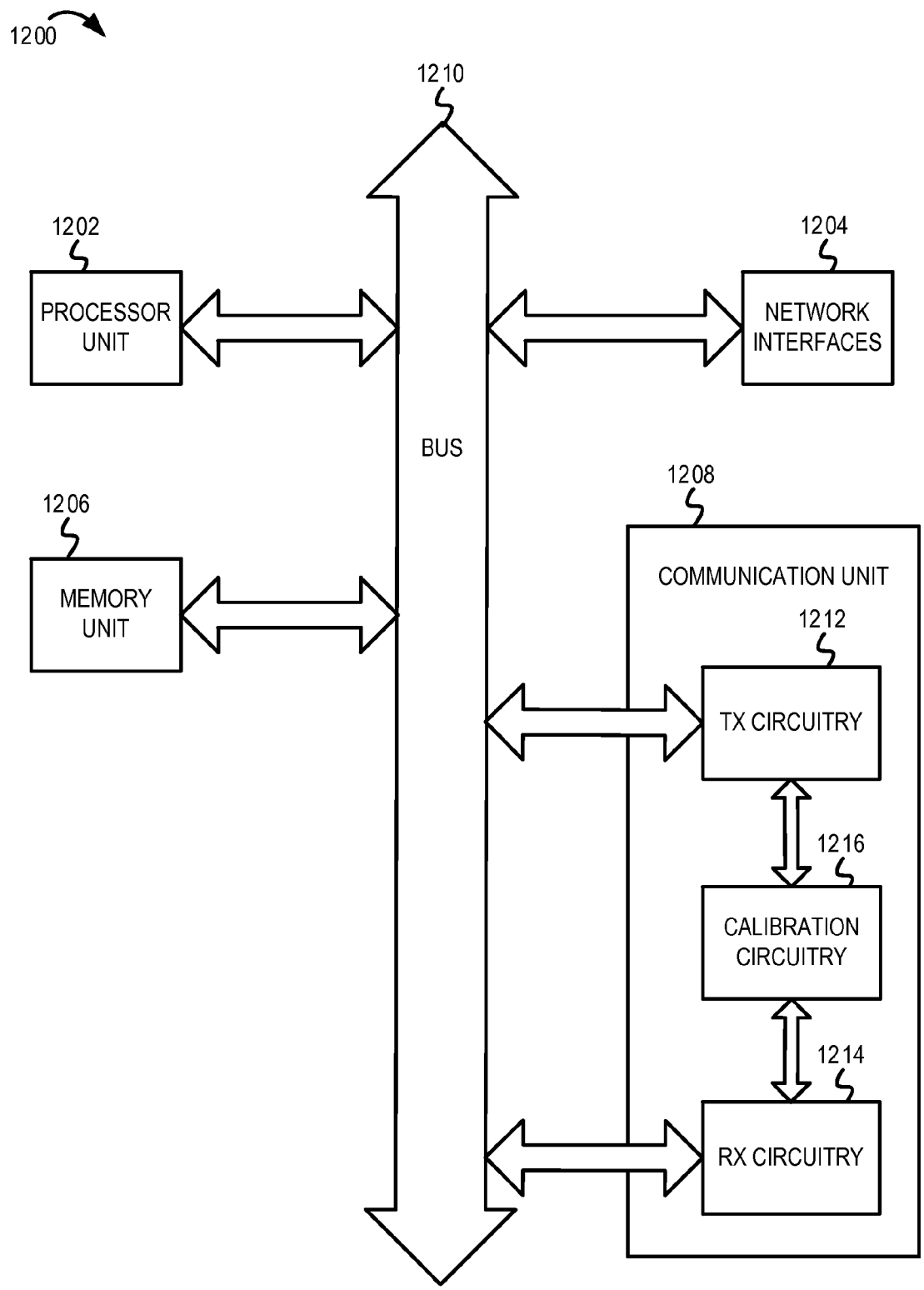
FIG. 12 is another example block diagram of one embodiment of an electronic device including a circuitry for implementing various embodiments of the present disclosure.

FIG. 12 is an example block diagram of one embodiment of an electronic device 1200 including calibration circuitry in accordance with this disclosure. In some implementations, the electronic device 1200 may be one of a laptop computer, a netbook, a mobile phone, a powerline communication device, a personal digital assistant (PDA), or other electronic systems comprising a hybrid communication unit configured to exchange communications across multiple communication networks (which form the hybrid communication network). The electronic device 1200 may include a processor unit 1202 (possibly including multiple processors, multiple cores, multiple nodes, and/or implementing multi-threading, etc.). The electronic device 1200 may include a memory unit 1206. The memory unit 1206 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The electronic device 1200 may also include a bus 1210 (e.g., PCI, ISA, PCI-Express, HyperTransport®, InfiniBand®, NuBus, AHB, AXI, etc.), and network interfaces 1204 that include at least one of a wireless network interface (e.g., a WLAN interface, a BLUETOOTH® (Bluetooth) interface, a WiMAX interface, a ZigBee® interface, a Wireless USB interface, etc.) and a wired network interface (e.g., an Ethernet interface, a powerline communication interface, etc.). In some implementations, the electronic device 1200 may support multiple network interfaces—each of which is configured to couple the electronic device 1200 to a different communication network.

The electronic device 1200 also a transmission circuitry 1212, a reception circuitry 1214 and calibration circuitry 1216. As described above in FIGS. 1-11, the transmission circuitry 1212 may include a configurable PEF component configured to compensate for the filter response of at least one analog component in the transmission circuitry 1212. The calibration circuitry 1216 may be coupled to the receiving circuitry 1214 and the transmission circuitry 1212 and may implement functionality to measure the filter response of the at least one analog component and generate PEF coefficient values for the PEF component. The calibration circuitry 1216 may also coordinate with various loopback circuits to perform different loopback tests to measure the frequency response of the transmission circuitry.

In some embodiments, the transmission circuitry 1212, reception circuitry 1214 and calibration circuitry 1216 may be included as part of a communication unit 1208. It should be understood, that in some embodiments, the communication unit 1208 may also have a dedicated processor (e.g., such as a communication unit comprising a system on a chip, or board with multiple chips, or multiple boards, in which the communication may have one or more dedicated processor or processing unit(s), in addition to the main processor 1202). Any one of these functionalities may be partially (or entirely) implemented in hardware and/or on the processor unit 1202. For example, the functionality may be implemented with an application specific integrated circuit, in logic implemented in the processor unit 1202, in a co-processor on a peripheral device or card, etc. Further, realizations may include fewer or additional components not illustrated in FIG. 12 (e.g., video cards, audio cards, additional network interfaces, peripheral devices, etc.). The processor unit 1202, the memory unit 1206, and the network interfaces 1206 are coupled to the bus

What is claimed is:

1. A device for transmitting signals via a communications channel, the device comprising:
   transmission circuitry that includes a pre-emphasis component to condition a digital predistortion (DPD) output signal,
   wherein the pre-emphasis component is configurable based at least in part on a measured frequency response associated with a first loopback circuit that includes at least an analog filter positioned between a DPD component and a power amplification (PA) component of the transmission circuitry.

2. The device of claim 1, further comprising:
   reception circuitry to process a received signal;
   the first loopback circuit coupling the transmission circuitry to the reception circuitry, wherein a transmitted signal from the transmission circuitry is received as a receive signal at the reception circuitry; and
   calibration circuitry to determine a configuration for the pre-emphasis component based at least in part on a comparison of the transmitted signal and the received signal.

3. The device of claim 2, further comprising:
   a second loopback circuit coupling the transmission circuitry to the reception circuitry, the second loopback circuit including fewer analog components of the transmission circuitry than the first loopback circuit,
   wherein the calibration circuitry is to enable the first loopback circuit for a first calibration test and is to enable the second loopback circuit for a second calibration test, and
   wherein the pre-emphasis component is further configurable based at least in part on results of the second calibration test.

4. The device of claim 1, wherein the measured frequency response includes non-linear distortions.

5. The device of claim 1, wherein the DPD component is to compensate for first signal distortion associated with the PA component, and wherein the pre-emphasis component is to compensate for second signal distortion associated with one or more intermediate components positioned between the DPD component and the PA component.

6. The device of claim 1, wherein the pre-emphasis component comprises a programmable finite impulse response filter.

7. The device of claim 1, wherein the pre-emphasis component is positioned after the DPD component and before the analog filter.

8. The device of claim 1, wherein the pre-emphasis component is positioned after the DPD component and before a digital-to-analog conversion (DAC) component of the transmission circuitry.

9. The device of claim 8, wherein the pre-emphasis component is to further compensate for signal distortions associated with the DAC component.

10. The device of claim 1, wherein the pre-emphasis component is to compensate for several intermediate components positioned between the DPD component and the PA component.

11. A method for using a pre-emphasis filter (PEF) component, the method comprising:
    determining a first measured frequency response associated with a first loopback circuit that includes at least one analog component positioned between a digital predistortion (DPD) component and a power amplification (PA) component of a transmission circuitry; and
    configuring the PEF component based at least in part on the first measured frequency response, wherein the PEF component is positioned after the DPD component and before the at least one analog component.

12. The method of claim 11, wherein the first measured frequency response includes amplitude response and phase response.

13. The method of claim 12, wherein configuring the PEF component comprises configuring the PEF component to flatten the amplitude response and linearize the phase response.

14. The method of claim 11, wherein the PEF component modifies a DPD output signal in a digital time domain to compensate for the first measured frequency response in an analog frequency domain.

15. The method of claim 11, wherein configuring the PEF component includes:
    enabling the first loopback circuit;
    measuring the first measured frequency response while the first loopback circuit is enabled; and
    determining a first configuration for the PEF component based at least in part on the first measured frequency response.

16. The method of claim 15, further comprising:
    enabling a second loopback circuit, the second loopback circuit including fewer analog components of the transmission circuitry than the first loopback circuit;
    measuring a second measured frequency response while the second loopback circuit is enabled; and
    determining a second configuration for the PEF component based at least in part on the second measured frequency response.

17. The method of claim 15, wherein said determining the first configuration includes:
    calculating complex coefficient values for the PEF component.

18. The method of claim 11, further comprising:
    receiving, at the PEF component, a DPD output signal from the DPD component; and
    conditioning, at the PEF component, the DPD output signal.

19. A method for calibrating a pre-emphasis filter (PEF) component of a transmission circuitry, the method comprising:
    enabling a first loopback circuit coupling the transmission circuitry and a receiving circuitry;
    transmitting a transmitted calibration signal via the transmission circuitry;
    receiving a received calibration signal via the receiving circuitry, the received calibration signal associated with the transmitted calibration signal;
    determining complex correlations between the transmitted calibration signal and the received calibration signal;
    generating coefficient values for the PEF component based at least in part on the complex correlations; and
    configuring the PEF component to use the coefficient values.

20. The method of claim 19, further comprising:
enabling a second loopback circuit coupling the transmission circuitry and the receiving circuitry, the second loopback circuit associated with a different calibration path; and
repeating said operations of transmitting, receiving, determining, and generating for the different calibration path.

21. An apparatus for an electronic device, the apparatus comprising:
a first loopback circuit coupling a transmission circuitry and a reception circuitry of the electronic device, wherein the first loopback circuit includes at least one analog component of the transmission circuitry;
means for determining a measured frequency response associated with the first loopback circuit; and
a pre-emphasis filter (PEF) component positioned in the transmission circuitry to condition a digital predistortion (DPD) output signal; and
means for configuring the (PEF) component based at least in part on the measured frequency response.

22. The apparatus of claim 21, wherein the reception circuitry is configured to process a received signal, the apparatus further comprising:
means for determining a configuration for the PEF component based at least in part on a comparison of a transmitted signal sent via the transmission circuitry and the received signal, wherein the means for configuring the PEF component is to use said configuration.

23. The apparatus of claim 22, further comprising:
a second loopback circuit coupling the transmission circuitry to the reception circuitry at different locations than the first loopback circuit; and
wherein the means for determining the configuration is to enable the first loopback circuit for a first calibration test and is to enable the second loopback circuit for a second calibration test, wherein the configuration is further based at least in part on results of the second calibration test.

24. The apparatus of claim 21, wherein the PEF component comprises a programmable finite impulse response filter.

25. The apparatus of claim 21, wherein the PEF component is positioned after a DPD component and before an analog filter.

26. The apparatus of claim 21, wherein the PEF component is positioned after a DPD component and before a digital-to-analog conversion (DAC) component of the transmission circuitry.

27. The apparatus of claim 26, wherein the PEF component is to compensate for signal distortions associated with the DAC component.

28. The apparatus of claim 21, wherein the PEF component is to compensate for several intermediate components positioned between a DPD component and a PA component.

* * * * *